United States Patent [19]
Ohno et al.

[11] Patent Number: 5,756,371
[45] Date of Patent: May 26, 1998

[54] PROCESS OF PRODUCING THIN FILM TRANSISTOR ARRAY

[75] Inventors: Seiji Ohno; Yukihisa Kusuda, both of Osaka, Japan

[73] Assignee: Nippon Sheet Glass Co., Ltd., Osaka, Japan

[21] Appl. No.: 439,444

[22] Filed: May 11, 1995

Related U.S. Application Data

[63] Continuation of Ser. No. 153,772, Nov. 17, 1993, abandoned.

[30] Foreign Application Priority Data

Nov. 18, 1992 [JP] Japan ................. 4-308425

[51] Int. Cl.$^6$ ............................... H01L 21/00
[52] U.S. Cl. ............ 438/30; 438/149; 438/158; 438/787
[58] Field of Search ............ 437/40 TFI, 41 TFI; 438/30, 149, 158, 782, 787

[56] References Cited

U.S. PATENT DOCUMENTS

| | | | |
|---|---|---|---|
| 4,389,481 | 6/1983 | Poleshuk et al. | 437/915 |
| 4,432,134 | 2/1984 | Jones et al. | 437/944 |
| 4,684,435 | 8/1987 | Kishi et al. | 148/DIG. 100 |
| 5,064,775 | 11/1991 | Chang | 433/21 |
| 5,068,207 | 11/1991 | Manocha et al. | 437/235 |
| 5,220,482 | 6/1993 | Takemura et al. | 361/311 |
| 5,236,874 | 8/1993 | Pintchovski | 437/245 |
| 5,270,233 | 12/1993 | Hamatake | 437/238 |
| 5,286,664 | 2/1994 | Horiuchi | 437/40 |
| 5,614,270 | 3/1997 | Yeh et al. | 427/539 |

FOREIGN PATENT DOCUMENTS

| | | | |
|---|---|---|---|
| 60-196959 | 10/1985 | Japan | 148/DIG. 100 |
| 0125986 | 1/1989 | Japan | |

OTHER PUBLICATIONS

Yoshitomi et al. AN 93:4461780 Inspec. Abstract of Characteristics of Si MOS Diodes Using Liquid Phase Deposited $SiO_2$ Films as Gate Insulator, Apr. 1993.

Homma et al. "A New Interlayer Formation Technology for Completely Planarized Multilevel Interconnection by Using LPD"; Jun. 1990 Symposium on VLSI Technology; pp.3–4.

Homma et al. "A Selective $SiO_2$ Film Formation Technology Using Liquid Phase Deposition for Fully Planarized Multilevel Interconnections"; J. Eelctrochem. Soc. vol. 140, No. 8, Aug. 1993, pp. 2410–2414.

*Primary Examiner*—Michael Trinh
*Attorney, Agent, or Firm*—Whitham, Curtis & Whitham

[57] ABSTRACT

A process of manufacture has the steps of forming a metal film on the insulating substrate, applying photoresist on the metal film, exposing the photoresist to light to form a photoresist pattern by developing, etching the metal film with the photoresist pattern as an etching mask, forming an insulating film on the insulating substrate by making the insulating substrate with the photoresist pattern contact a liquid-phase deposition treatment liquid, and removing the photoresist pattern or the combination of the photoresist pattern and the insulating film thereon. Through these steps, the metal film for use as the metal wiring to effect contact with the electrode of the TFT is buried in the surface of the insulating substrate. Consequently, the resistance of the metal wiring can greatly be reduced. Thereby, it is produced a thin film transistor capable of rendering an large area, large capacity display possible and free from a difference in level.

20 Claims, 5 Drawing Sheets

1

PROCESS OF PRODUCING THIN FILM TRANSISTOR ARRAY

This is a Continuation of Application Ser. No. 08/153,772 filed Nov. 17, 1993, now abandoned.

BACKGROUND OF THE INVENTION

1. Field of the Invention

The present invention relates to improvements in the performance of thin film transistor arrays for use in liquid crystal displays, image sensors and the like.

2. Description of the Conventional Art

Active matrix driven liquid crystal displays are being increasingly used because of high display quality. However, conventional liquid crystal displays have posed various problems as they are intended to make a large area, high definition display.

FIG. 6 shows a sectional structure of a thin film transistor (TFT) for use in a conventional liquid crystal display. In FIG. 6, numeral 1 denotes a glass substrate, 31 a gate electrode, 32 a gate insulating film, 33 a pixel electrode, 34 a noncrystalline silicon layer, 35 a drain electrode to be connected to the pixel electrode 33, 36 an n-type noncrystalline silicon layer for establishing the ohmic contact between the noncrystalline silicon layer 34 and the drain electrode 35, 37 a source electrode for supplying an image signal from the outside, the source electrode 37 being connected via an n-type noncrystalline silicon layer 38 to the noncrystalline silicon layer 34. The source electrode 37 is connected to an electrode 39, which is so wired as to apply the image signal to the TFT of each pixel.

FIG. 7 shows a top view of a TFT array. In FIG. 7, numeral 40 denotes a gate selection line and 41 a TFT. The gate selection line 40 is electrically connected to the gate electrode 31 of FIG. 6. Moreover, the gate electrode 31 and the gate selection line 40 are formed of a thin metal film made of the same material.

In order to operate the TFT array, a selective voltage is applied to the gate selection line 40 to turn on all TFTs 41 connected to one gate selection line 40. When a pixel signal voltage is applied to the electrode 39 at this timing, the voltage is written to the pixel electrode 33. When the selective voltage is applied to an adjoining gate selection line 40 at the subsequent timing, the image signal voltage is written to the pixel electrode 33 connected to the TFT likewise. By repeating this operation, the orientation of the liquid crystals formed on the TFT array is so controlled that an image may be displayed.

However, various problems have ensued as the display capacity of the liquid crystal display becomes large. That is, definition of the display becomes high. These problems may be summarized as follow:

As the display capacity becomes large, an area to be allotted to one pixel inevitably decreases. On the other hand, the aperture ratio (the ratio of an area capable of display to the total area) of the TFT 41 decreases because the area occupied by the gate selection line and an image supply power line is relatively small. Therefore, the utilization efficiency of illumination is reduced and the image that has been displayed tends to darken.

Furthermore, if the width of the gate selection line 40 is reduced to improve the aperture ratio, the resistance of the gate selection line 40 increases and its response speed tends to lower because of the parasitic capacity. Therefore, the voltage applied to the gate of the TFT 41 becomes insufficient and the writing of the image signal to the pixel electrode also becomes unsatisfactory. This phenomenon poses a serious problem when a large area, large capacity display is made. A method of solving this problem then to be followed is to increase the thickness of the thin wiring film. If, however, the film thickness is increased, the thickness of the gate electrode 31 of FIG. 6 will also increase, thus enlarging a difference in level. For this reason, a short will be induced in the portion different in level and this is problematical in view of the process of manufacturing TFTs.

When the gate electrode 31 made of Ta (Tantalum) metal material is employed in the conventional TFT array, the film is usually about 0.3 μm thick and 10 μm wide. It is well known that the electric resistivity of Ta itself is 12[μΩ.cm]. A sheet resistance 0.4 Ω/□ is calculated by 12 μΩ.cm÷0.3 μm. The wiring resistance R is calculated from an equation R=ρ·(l/A). (ρ: resistivity, A: cross section, l: length) Therefore, the wiring resistance per 1 mm length wiring is about 40 [Ω].

In the case of a conventional large-sized liquid crystal display with one side about 30 cm long, its resistance value up to the end of the substrate is about 12 kΩ. When it is attempted to drive a parasitic capacity of 1,000 pF at the value above, a constant at RC is 12 μs. Therefore, 24 μs is required for only the constant at RC including rise and decay time. On the other hand, writing should be completed at 30 μs or less per line when a television system is taken into consideration. In order to write image data completely, the time required is at least two to three times greater than the constant at RC, that is, about 75 μs. Consequently, the writing of data is unsatisfactory in the neighborhood of the end of gate electrode 31, though the writing of data is possible enough in the neighborhood of the point at which power is supplied to the gate electrode 31. As a result, the image quality remains at low levels.

SUMMARY OF THE INVENTION

An object of the present invention made to solve the foregoing problems that have conventionally been posed is to provide a process of simply producing such a TFT array capable of rendering a large area, large capacity display possible and free from a difference in level that its area is readily enlarged.

In order to accomplish the above object according to the present invention, a process of producing a TFT array comprises the steps of forming a metal film on the insulating substrate, applying a photoresist on the metal film, exposing the photoresist to light to form a photoresist pattern by developing, etching the metal film with the photoresist pattern as an etching mask, forming an insulating film on the insulating substrate by making the insulating substrate with the photoresist pattern contact a liquid-phase deposition treatment liquid, and removing the photoresist pattern or the combination of the photoresist pattern and the insulating film thereon.

The liquid-phase deposition treatment liquid should preferably contain a hydracid silicofluoride aqueous solution in which silicon dioxide becomes supersaturated.

DETAILED DESCRIPTION OF PREFERRED EMBODIMENTS

Figure 1:
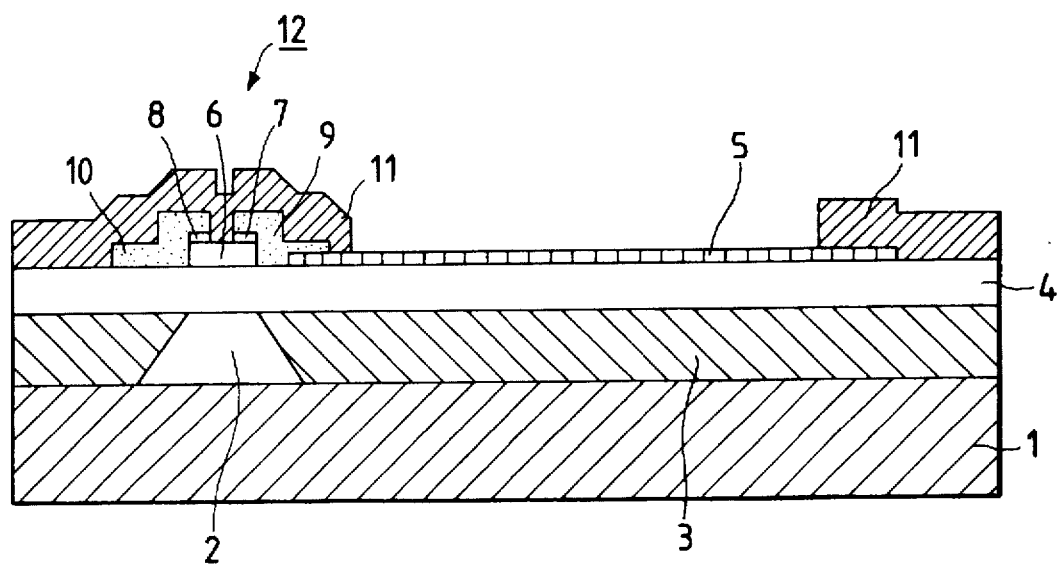
FIG. 1 is a sectional view of a first embodiment of the present invention.

FIG. 1 is a sectional view of the principal part of a TFT array prepared through process steps according to the present invention. In FIG. 1, numeral 1 denotes a glass substrate as an example of an insulating substrate; 2, metal wiring whose surface corresponds to that of an insulating film 3 on the glass substrate 1. The structure of a TFT 12 formed on the surface of the metal wiring 2 and the insulating film 3 is similar to that of the conventional TFT. More specifically, a gate insulating film 4 is formed on the metal wiring 2 and the insulating film 3; a pixel electrode 5 and a noncrystalline silicon layer 6 in part of the gate insulating film 4; and an n-type noncrystalline silicon layer 7 for establishing the ohmic contact between the noncrystalline silicon layer 6 and a drain electrode 9 on the noncrystalline silicon layer 6. Numeral 10 denotes a source electrode for supplying a pixel signal from the outside, the source electrode being connected via an n-type noncrystalline silicon layer 8 to the noncrystalline silicon layer 6.

Figure 2:
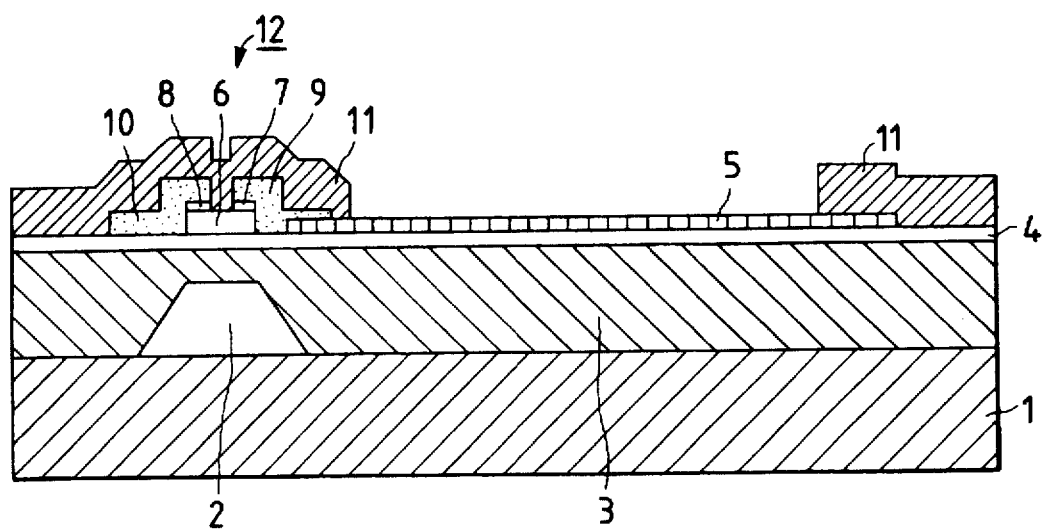
FIG. 2 is a sectional view of a second embodiment of the present invention.

According to a second embodiment of the present invention shown in FIG. 2, the metal wiring 2 is buried in the insulating film 3 and the surface of the insulating film 3 is smoothed. The structure of the TFT 12 formed on the surface of the insulating film 3 is similar to that in the TFT array of FIG. 1.

For the glass substrate, soda lime glass, quartz glass, borosilicate glass or the like may be used. As to the metal wiring 2, it is preferred to use metal material therefor which is corrosion-resistant to the liquid-phase deposition treatment liquid; however, the preference is not limited thereto on condition that the corrosion-resistance to the liquid-phase deposition treatment liquid is secured by forming an oxide film on the surface of the metal material. Moreover, the metal material should preferably have low resistivity and, in view of this, Ta, Cr, Al or Cu is fit for use.

Referring to FIGS. 3, 4, a manufacturing process embodying the present invention will subsequently be described. FIGS. 3a to 3f are a schematic flow diagram illustrating the steps of manufacturing the TFT array of FIG. 1. FIGS. 4a to 4g are schematic flow diagrams illustrating the steps of manufacturing the TFT array of FIG. 2.

Figure 3A:
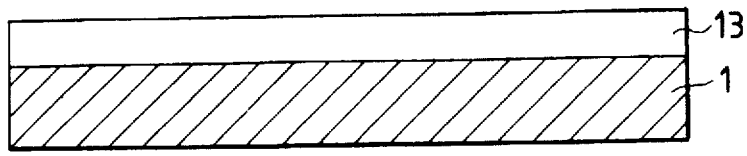
FIGS. 3a to 3f are schematic flow diagrams illustrating process steps according to the first embodiment of the present invention.
Figure 4A:
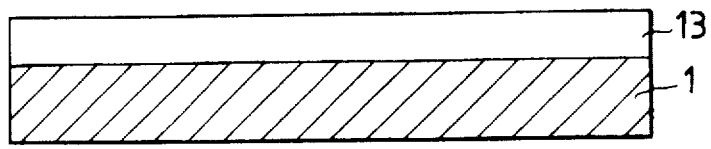
FIGS. 4a to 4g are schematic flow diagrams illustrating process steps according to the second embodiment of the present invention.

First, a metal film 13 is formed on the glass substrate 1 (FIG. 3a, FIG. 4a). Sputtering, vapor deposition or CVD may be employed for film formation. Thickness of the metal film 13 thus formed is about 0.5~10 μm thick.

Figure 3B:
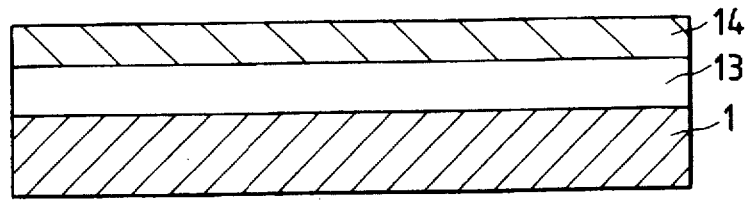
Figure 4B:
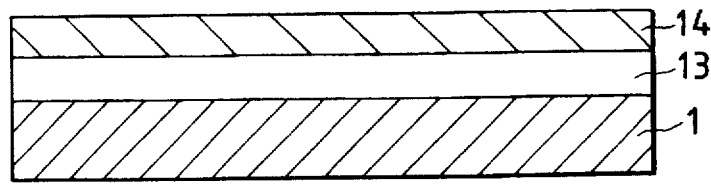

Subsequently, photoresist 14 is applied to the metal film 13 (FIG. 3b, FIG. 4b). Although the composition of the photoresist 14 is not restrictive, the use of inorganic substances allows an insulating film to be formed even on the photoresist 14 during the formation of the insulating film as will be described later and this will make it difficult to remove the photoresist at the next stage. For this reason, organic substances are preferred for use as the photoresist 14. Such an organic substance may be positive (the portion exposed to light is readily soluble) or negative (the portion exposed to light is hardly soluble) as long as it is photosensitive resin.

Figure 3C:
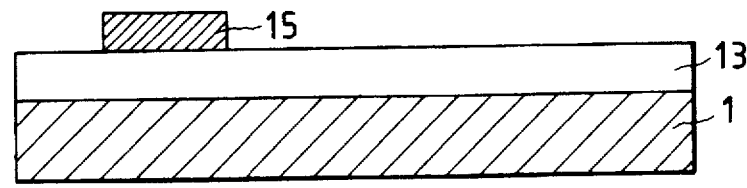
Figure 3D:
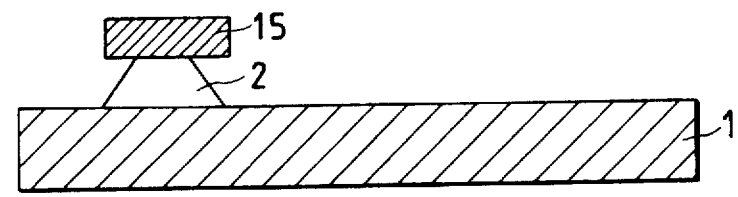
Figure 4C:
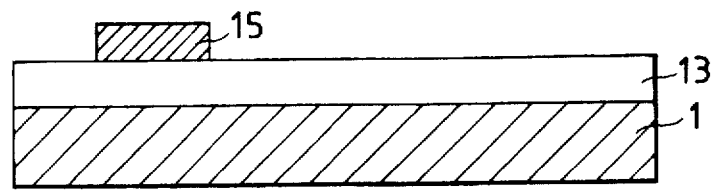
Figure 4D:
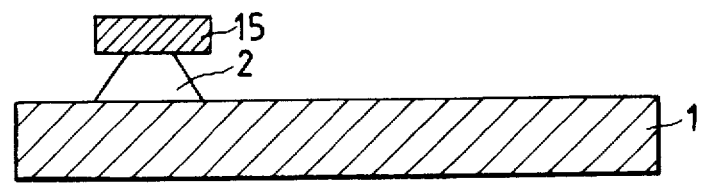

The photoresist 14 is exposed to light through a predetermined photomask before being developed to obtain a photoresist pattern 15 whose portion to be etched remains open (FIG. 3c, FIG. 4c). Then the metal film 13 is etched with the photoresist pattern 15 as an etching mask, whereby the metal wiring 2 is formed on the glass substrate 1 (FIG. 3d, FIG. 4d).

Figure 3E:
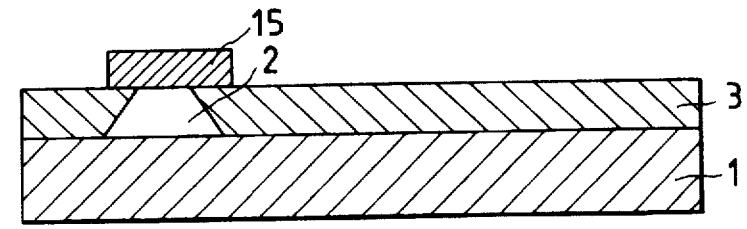
Figure 4E:
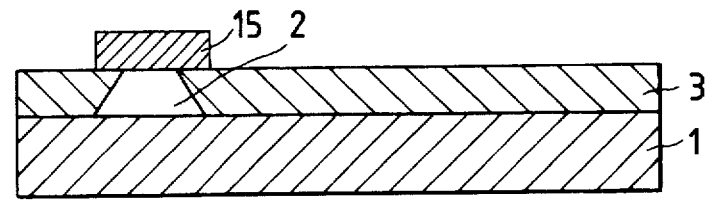

Subsequently, the insulating film 3 is formed on the glass substrate 1 by making the glass substrate 1, with the photoresist pattern 15 formed on the metal wiring 2, contact the liquid-phase deposition treatment liquid. When an organic photosensitive resin is used as the photoresist 14, the insulating film 3 is formed in an area excluding the metal wiring 2 on the glass substrate 1 (FIG. 3e, FIG. 4e). The insulating film 3 should preferably be as thick as the metal wiring 2.

Although a contact method as the method of letting the liquid-phase deposition treatment liquid flow down onto the surface of the glass substrate 1 may be used to make the treatment liquid contact the glass substrate 1, it is preferred to employ a simple method of immersing the glass substrate in an immersion bath filled with the treatment liquid because a uniform film is made available.

Figure 5:
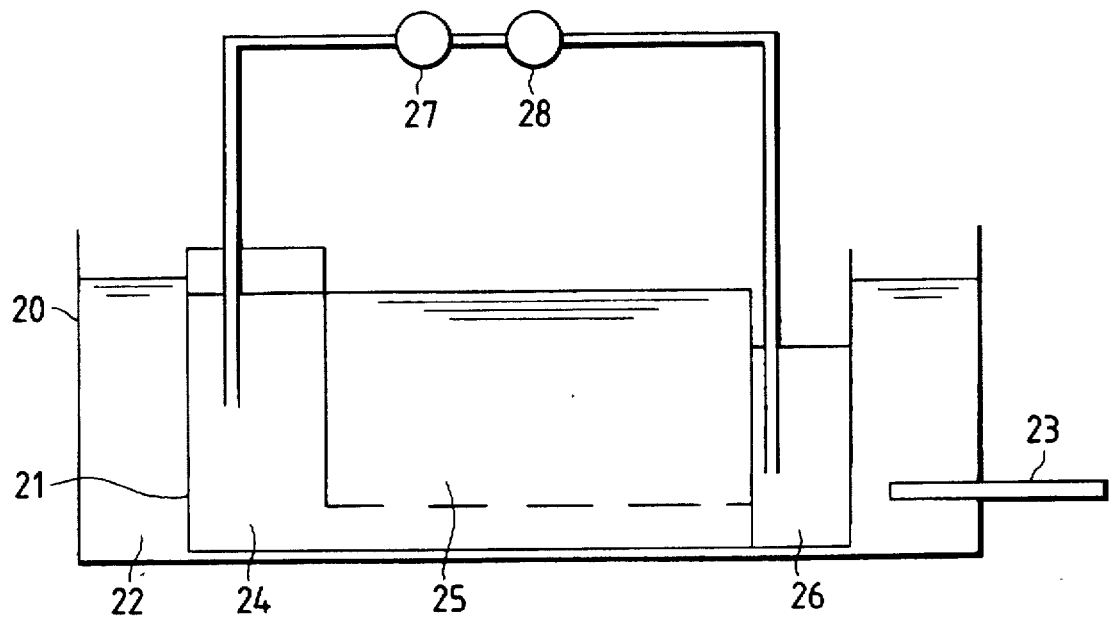
FIG. 5 is a system diagram of an insulating film forming apparatus for use in the embodiment of the present invention.
Figure 6:
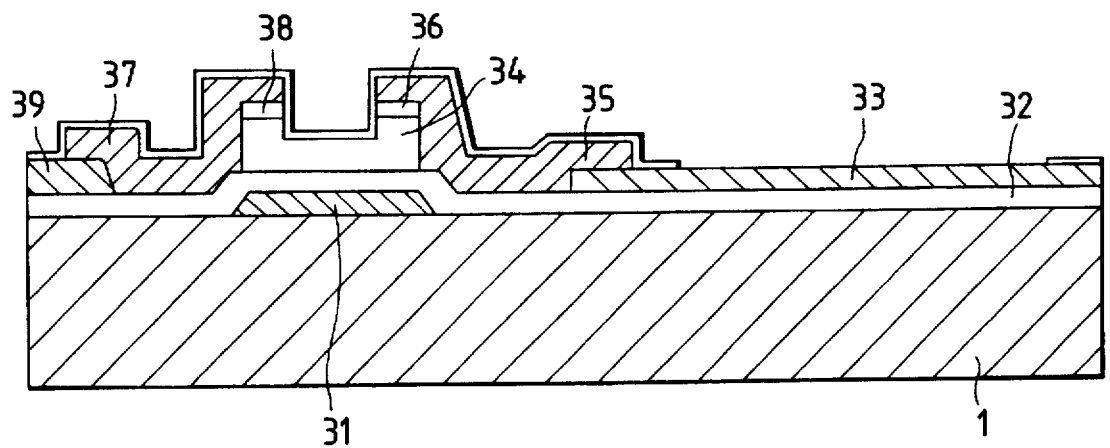
FIG. 6 is a sectional structural diagram of a conventional TFT array.
Figure 7:
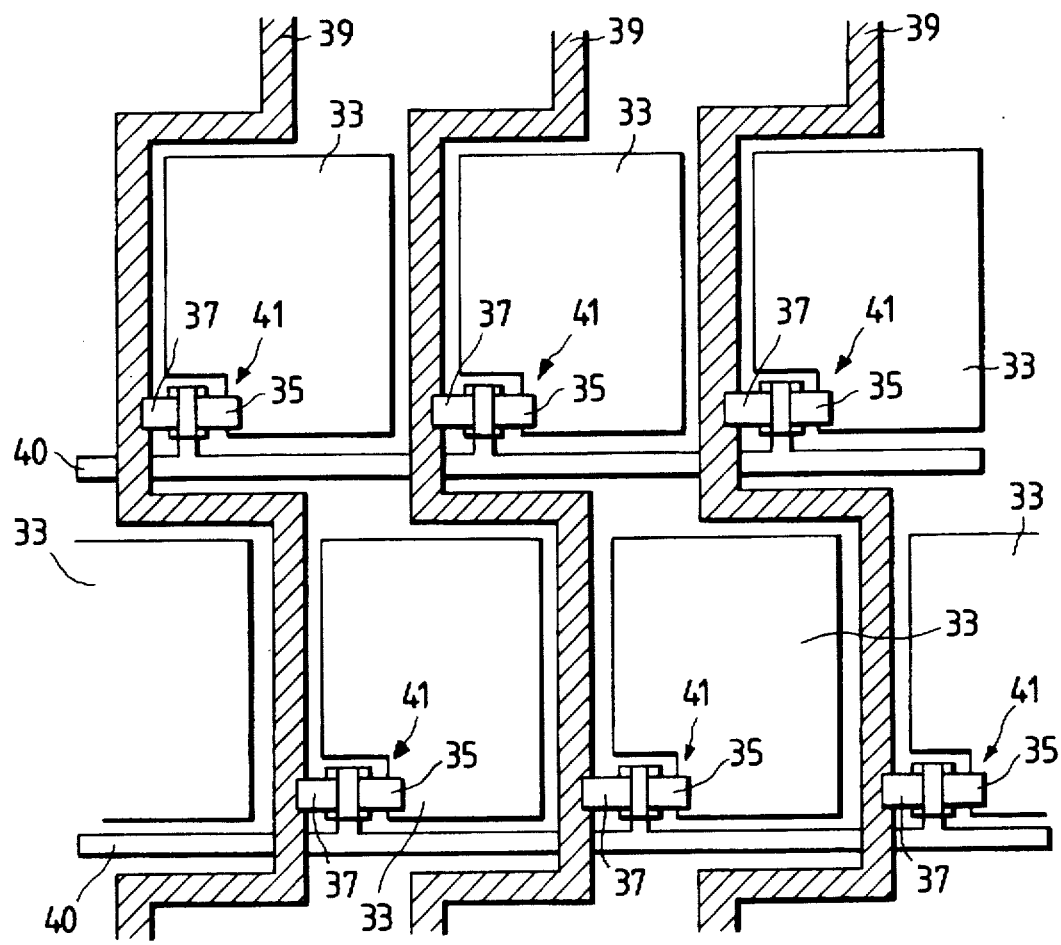
FIG. 7 is a top view of the conventional TFT array.

A conventionally known apparatus for forming an insulating film may be used in the method of immersing the glass substrate in the immersion bath as shown in FIG. 5. More specifically, the apparatus for forming an insulating film comprises an external and an internal tank 20, 21 and the gap therebetween is filled with water 22. The temperature of the water is so controlled by a temperature regulator 23 as to remain at a constant level. The internal tank 21 includes a front, a middle and a rear portion 24, 25, 26, each of which is filled with a saturated aqueous solution as the treatment liquid. Numeral 27 denotes a circulating pump and 28 a filter.

Figure 3F:
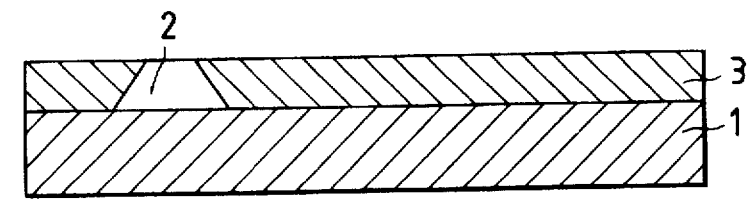
Figure 4F:
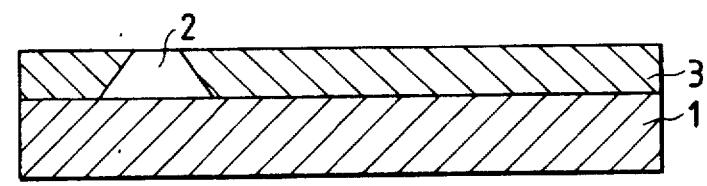

Subsequently, the glass substrate 1 with the insulating film 3 formed thereon is immersed in a release solution to remove the photoresist pattern 15 or the photoresist pattern 15 and the insulating film 3 thereon (FIG. 3f, FIG. 4f). The above method of forming an insulating film is effective in easily removing the photoresist pattern 15 as no insulating film 3 is formed on the photoresist pattern 15 or otherwise the insulating film, if formed, is in the form of particles (the reason for this is assumed attributable to the wetting characteristics of the photosensitive resin of the photoresist pattern with respect to the treatment liquid).

Figure 4G:
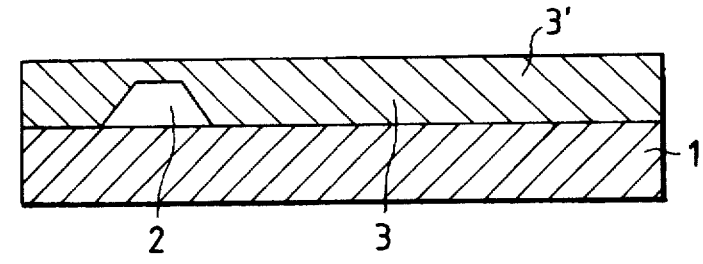

Although the TFT 12 may be formed on the glass substrate 1 with the metal wiring 2, another insulating film 3' may be formed on the metal wiring 2 and the insulating film 3 by immersing the glass substrate 1 in the immersion bath again (FIG. 4g). At this time, the additional insulating film 3' formed on the metal wiring 2 and the insulating film 3 should preferably be about 0.05~0.5 μm thick.

Although the insulating films 3, 3' thus formed are sufficiently dense, they may be made denser by heat-treating them at 400°~500° C. for about 30 minutes.

The TFT is formed on the glass substrate 1 through the conventionally known method. Incidentally, the metal wiring 2 becomes a gate selection line in a TFT of reverse stagger structure and a source/drain electrode line in another of forward stagger structure.

According to the present invention, the metal film for use as the metal wiring for effecting contact with the electrode of the TFT is buried in the surface of the insulating substrate to cancel a difference in level. Consequently, a large sectional area of the metal wiring can be secured without causing any short to the metal wiring. In other words, the resistance of the metal wiring can greatly be reduced to the extent that the problem of propagation delay on the gate line due to the internal parasitic resistance of the metal wiring is overcome. Moreover, the smooth surface of the insulating substrate serves to facilitate the formation of the insulating substrate on the TFT and to improve the coupling efficiency.

While the resistance of the metal wiring is set constant, its width can be made variable so as to improve the aperture ratio.

(Example 1)

First a soda lime glass substrate 1 was immersed in a 0.5 wt % HF aqueous solution for five minutes and then sufficiently rinsed and dried. Subsequently, a Cr film 13 about 1 μm thick was formed by vacuum deposition on the glass substrate 1.

Negative photoresist 14 (Trade Name: OMR-85, Tokyo Ohka Kogyo Co., Ltd.) was applied to the surface of the Cr film 13 on the glass substrate 1. After this, the photoresist 14 was immediately pre-baked by a hot-air circulating drier at 70° C. for 20 minutes. Then an exposure device was used to expose the photoresist 14 for 1.5 seconds to form a photoresist pattern 15 on the surface of the Cr film 13. After the exposure, the photoresist pattern 15 was immersed in an OMR developing solution for one minute to develop it. Subsequently, the photoresist pattern 15 was rinsed with rinsing liquid (an OMR rinsing solution) and further sufficiently rinsed with pure water before being dried. Then the Cr film 13 was etched with the photoresist pattern 15 as an etching mask and Cr wiring 2 was subsequently provided.

An insulating film forming apparatus was used to form a silicon dioxide film 3 on the glass substrate 1. A circulating pump 27 was first operated to pump out a fixed amount of treatment liquid in the rear portion 26 of an internal tank at a time and the treatment liquid was passed through a filter 28 and then returned to the front portion 24 thereof. The circulation of the treatment liquid was thus started. The amount of treatment liquid thus circulated was 240 ml/min. The glass substrate 1 with the photoresist pattern 15 sticking to the Cr wiring 2 was immersed horizontally in the middle portion of the internal tank. By keeping the glass substrate 1 in this state, the silicon dioxide film 3 substantially as thick (about 1 μm thick) as the Cr wiring 2 in an area excluding the Cr wiring 2 on the glass substrate 1.

Subsequently, the glass substrate 1 was immersed in a release solution (an OMR release solution—502) to remove the photoresist pattern 15. Then the glass substrate 1 was heat-treated at 400° C. for 30 minutes. Further, a TFT 12 was formed on the glass substrate 1 and the Cr wiring 2 was caused to function as gate wiring and a gate electrode.

(Example 2)

The glass substrate 1 used in Example 1 was prepared and an Al film 13 about 1 μm thick was formed by sputtering on the glass substrate 1. Subsequently, Al wiring 2 was provided on the Al film 13 on the glass substrate 1 through the steps of applying photoresist, exposure, developing and etching under the same condition in Example 1.

An alumina coat was formed by anodizing the surface of the Al wiring 2 beforehand because the Al wiring 2 is less corrosion-resistant to the liquid-phase deposition treatment liquid. The alumina coat was formed by anodizing with an Al film as the anode in such a way that the Al film was connected via a d.c. power supply to the cathode immersed in a citric acid solution and voltage was applied thereto.

The insulating film forming apparatus was used to form a silicon dioxide film 3 in an area excluding the Al wiring 2 on the glass substrate 1.

After keeping the glass substrate 1 immersed in the middle portion 25 of the internal tank for about 10 hours, the glass substrate 1 was pulled out of the middle portion thereof at a point of time the silicon dioxide film 3 formed thereon substantially became as thick (about 1 μm thick) as the Al wiring 2. The glass substrate 1 was then immersed in the release solution (OMR release solution—502) to remove the photoresist pattern 15.

Subsequently, the glass substrate 1 was again immersed in the middle portion 25 of the internal tank of the insulating film forming apparatus to form another silicon dioxide film 3 about 0.1 μm thick on the Al wiring 2 and the silicon dioxide film 3. Then the glass substrate 1 was heat-treated at 400° C. for 30 minutes. Further, a TFT 12 was formed on the glass substrate 1 and the Al wiring 2 was caused to function as gate wiring and a gate electrode.

According to the present invention, the insulating substrate with the metal wiring and the metal film buried therein for the TFT array is obtainable simply through the process steps stated above.

Since the metal wiring is buried in the surface of the insulating substrate, the resistance of the metal wiring can greatly be reduced and shortcircuiting trouble of the TFT due to a difference in level can also be eliminated. Even when the TFT is applied to a large capacity, large area display, the propagation delay of the metal wiring decreases and this prevents image quality from deteriorating. Further, the width of the metal wiring is reduced by providing metal wiring in greater length-to-breadth proportion and the aperture ratio can thus be increased.

What is claimed is:

1. A process for producing a thin film transistor array for use in a liquid crystal display by forming a plurality of thin film transistors on an insulating substrate, said process consisting essentially of:

forming a metal film to have a thickness of 0.5 um to 10 um directly on said insulating substrate;

applying a photoresist on said metal film;

exposing said photoresist to light to form a photoresist pattern by developing;

etching said metal film with said photoresist pattern as an etching mask to form a metal pattern having a resistance below 40 Ω/mm such that image data can be written to said thin film transistor array in less than 30 μs;

forming an insulating film selectively on a portion of said insulating substrate from which said metal film was etched in said etching step, such that a thickness of said insulating film is made equal to that of said metal pattern, said forming step including a single processing step comprising making said insulating substrate with said photoresist pattern contact a liquid-phase deposition treatment liquid; and removing the photoresist pattern.

2. The process as claimed in claim 1, wherein said liquid-phase deposition treatment liquid contains a hydracid silicofluoride aqueous solution in which silicon dioxide becomes supersaturated, whereas said photoresist is an organic photosensitive resin.

3. The process as claimed in claim 1, wherein another insulating film is formed on said insulating film and said metal film.

4. The process according to claim 1, wherein said liquid-phase deposition treatment liquid includes a hydracid silicofluoride aqueous solution in which silicon dioxide becomes supersaturated.

5. The process according to claim 1, wherein said photoresist comprises an organic photosensitive resin.

6. The process according to claim 1, wherein said insulating substrate comprises glass.

7. The process according to claim 1, wherein said step of forming a metal film comprises forming one of Ta, Cr, Al and Cu on said insulating substrate.

8. The process according to claim 1, wherein said step of forming a metal film comprises a step of forming a metal film corrosion-resistant to said liquid-phase deposition treatment liquid.

9. The process according to claim 1, wherein said step of forming a metal film on said insulating substrate comprises a step of depositing said metal film on said insulating substrate by one of sputtering, vapor deposition and chemical vapor deposition.

10. The process according to claim 1, wherein said step of forming an insulating film includes immersing said insulating substrate in said liquid-phase deposition treatment liquid.

11. The process according to claim 3, wherein said another insulating film has a thickness in a range of 0.05 μm to 0.5 μm.

12. A process for producing a thin film transistor array for use in a liquid crystal display by forming a plurality of thin film transistors on an insulating substrate, said process consisting essentially of:

forming a metal film to have a thickness of 0.5 um to 10 um directly on said insulating substrate;

applying a photoresist on said metal film;

exposing said photoresist to light to form a photoresist pattern by developing;

etching said metal film with said photoresist pattern as an etching mask to form a metal pattern having a resistance below 40 Ω/mm such that image data can be written to said thin film transistor array in less than 30 μs;

forming an insulating film selectively on a portion of said insulating substrate from which said metal film was etched in said etching step, such that a thickness of said insulating film is made equal to that of said metal pattern, said forming step including making said insulating substrate with said photoresist pattern contact a liquid-phase deposition treatment liquid;

removing the photoresist pattern; and heat-treating said insulating film at a temperature in a range of 400° C. to 500° C.

13. The process according to claim 12, wherein said liquid-phase deposition treatment liquid includes a hydracid silicofluoride aqueous solution in which silicon dioxide is supersaturated.

14. The process according to claim 12, wherein said photoresist comprises an organic photosensitive resin.

15. A process for producing a thin film transistor array for use in a liquid crystal display by forming a plurality of thin film transistors on an insulating substrate, said process consisting essentially of:

forming a metal film to have a thickness of 0.5 um to 10 um directly on said insulating substrate;

applying a photoresist on said metal film;

exposing said photoresist to light to form a photoresist pattern by developing;

etching said metal film with said photoresist pattern as an etching mask to form a metal pattern having a resistance below 40 Ω/mm such that image data can be written to said thin film transistor array in less than 30 μs;

forming an insulating film selectively on a portion of said insulating substrate from which said metal film was etched in said etching step, such that a thickness of said insulating film is made equal to that of said metal pattern, said forming step including making said insulating substrate with said photoresist pattern contact a liquid-phase deposition treatment liquid;

removing the photoresist pattern;

forming another insulating film on said insulating film and said metal pattern, thereby covering said metal pattern with said insulating film and said another insulating film; and heat-treating said another insulating film and said insulating film at a temperature in a range of 400° C. to 500° C.

16. The process according to claim 15, wherein said liquid-phase deposition treatment liquid includes a hydracid silicofluoride aqueous solution in which silicon dioxide is supersaturated.

17. The process according to claim 15, wherein said photoresist comprises an organic photosensitive resin.

18. A process for producing a thin film transistor array for use in a liquid crystal display by forming a plurality of thin film transistors on an insulating substrate, said process consisting essentially of:

forming a metal film to have a thickness of 0.5 um to 10 um directly on said insulating substrate;

applying a photoresist on said metal film;

exposing said photoresist to light to form a photoresist pattern by developing;

etching said metal film with said photoresist pattern as an etching mask to form a metal pattern having a resistance below 40 Ω/mm such that image data can be written to said thin film transistor array in less than 30 μs;

forming an insulating film selectively on a portion of said insulating substrate from which said metal film was etched in said etching step, such that a thickness of said insulating film is made equal to that of said metal pattern, said forming step including in a single processing step comprising making said insulating substrate with said photoresist pattern contact a liquid-phase deposition treatment liquid;

removing the photoresist pattern; and forming another insulating film on said insulating film and said metal pattern, thereby covering said metal pattern with said insulating film and said another insulating film.

19. The process according to claim 18, wherein said liquid-phase deposition treatment liquid includes a hydracid silicofluoride aqueous solution in which silicon dioxide is supersaturated.

20. The process according to claim 18, wherein said photoresist comprises an organic photosensitive resin.

* * * * *